United States Patent [19]

Morita

[11] Patent Number: 5,360,646
[45] Date of Patent: Nov. 1, 1994

[54] CHEMICAL VAPOR DEPOSITION METHOD OF SILICON DIOXIDE FILM

[75] Inventor: Katsumi Morita, Matsudo, Japan

[73] Assignee: Applied Materials, Inc., Santa Clara, Calif.

[21] Appl. No.: 115,387

[22] Filed: Sep. 1, 1993

[30] Foreign Application Priority Data

Sep. 10, 1992 [JP] Japan ................... 4-242145

[51] Int. Cl.$^5$ ................... B05D 3/06; C23C 16/00
[52] U.S. Cl. ................... 427/574; 427/579; 427/255.3; 427/255.2; 427/255.1; 427/255; 437/238
[58] Field of Search ............... 427/255.3, 255.2, 255.1, 427/255, 248.1, 579, 574, 578; 437/238

[56] References Cited

U.S. PATENT DOCUMENTS

| | | | |
|---|---|---|---|
| 4,845,054 | 7/1989 | Mitchener | 437/238 |
| 4,872,947 | 10/1989 | Wang et al. | 156/643 |
| 4,992,306 | 2/1991 | Hochberg et al. | 427/255.3 |
| 5,051,380 | 9/1991 | Maeda et al. | 437/238 |

FOREIGN PATENT DOCUMENTS 59-50168 3/1984 Japan .

OTHER PUBLICATIONS

Nguyen et al, "Reaction Mechanisms of Plasma- and Thermal-Assisted Chemical Vapor Deposition of Tetraethylorthosilicate Oxide Films", J. Electrochem. Soc., vol. 137, No. 7, Jul. 1990, pp. 2209-2215.

Primary Examiner—Roy V. King
Attorney, Agent, or Firm—Randy W. Tung

[57] ABSTRACT

A chemical vapor deposition method that utilizes conventional CVD equipment to deposit silicon dioxide films is provided. The method is capable of producing excellent step coverage on substrates with steep step portions. Tetra-ethoxy-ortho-silicate, acetic-acid, and water are independently gasified by gasifiers and are fed into a reaction chamber. The mixed vapor is heated in the chamber to activate a chemical reaction so that high-fluidity tetra-hydroxy-silicon can be uniformly deposited on a semiconductor substrate containing step portions. Subsequently, two water molecules are detached from tetra-hydroxy-silicon in a dehydration process thereby forming silicon dioxide.

4 Claims, 2 Drawing Sheets

CHEMICAL VAPOR DEPOSITION METHOD OF SILICON DIOXIDE FILM

FIELD OF THE INVENTION

The present invention generally relates to a novel method of forming a silicon dioxide film on a semiconductor substrate and more particularly, relates to a novel method of forming a silicon dioxide film on a semiconductor substrate by reacting a mixture of reactant gases of tetra-ethoxy-ortho-silicate (or TEOS) and activated oxygen in a carrier gas of oxygen.

BACKGROUND OF THE INVENTION

Chemical vapor deposition (or CVD) method has been used in the deposition of silicon dioxide films on semiconductor substrates. In this method, a gas containing the structural elements of the film material to be formed is fed into a chamber, followed by heating of the gas to induce a chemical reaction to deposit the desired film on the semiconductor substrate. In a conventional CVD method, a silicon dioxide film is deposited by the chemical reaction between silane ($SiH_4$) and oxygen. This method enables the formation of a silicon dioxide film at a relatively low temperature.

The conventional CVD method of depositing silicon dioxide films by using silane and other reactant gases causes a step coverage problem, i.e., failure of coverage of the steep step portion in an advanced semiconductor element configuration by a film of uniform thickness. Others have attempted to solve this step coverage problem by utilizing a reactant of tetra-ethoxy-ortho-silicate. TEOS has better coverage characteristics than silane, however, TEOS must be used at high reaction temperatures due to its low reactivity. Attempts have been made to increase the reactivity of TEOS by means of plasma formation such that the reaction can be carried out at a lower temperature. Attempts have also been made to use ozone which has a higher reactivity than oxygen.

A problem arises when TEOS is used to replace silane in order to improve the step coverage. Conventional CVD equipment such as atmospheric-pressure CVD, reduced-pressure CVD, and plasma CVD cannot be used due to the fact that TEOS must be processed at a high temperature.

Additional problems occur when plasma is used to enable the use of TEOS in a low temperature CVD process because the intermediate reactant of tetra-hydroxy-silicon ($Si(OH)_4$) has a short lifetime. As a consequence, silicon dioxide with a cross-linked configuration is already formed before it flows into the grooves of the step portion and thus improvement of the step coverage cannot be realized.

When ozone is used to replace oxygen, although the step coverage is improved, the quality of the entire silicon dioxide film deposited on the substrate depends significantly on the ozone concentration. When ozone is generated by electrical discharge in oxygen, it decomposes to oxygen easily and hence the stability of the concentration is poor. As a result, it is very difficult to feed ozone at a high concentration into the reaction chamber. In addition, in the high-energy discharge process for generating ozone, undesirable metal impurities may be blended and particles may be generated.

Furthermore, in a conventional chemical vapor deposition, the process must be performed in two stages. In the first stage, an organic solvent containing the structural elements of the film is used to coat the substrate. In the second stage, heating is performed such that the film is formed on the substrate. When the deposition of a thick film is desired, the two stage operation must be performed repeatably. It is difficult to maintain a high degree of uniformity for a large-diameter semiconductor substrate used in present-day semiconductor manufacturing. This is a significant disadvantage which affects quality and yield of production.

It is therefore an object of the present invention to provide a novel method of depositing silicon dioxide films on a semiconductor substrate by a chemical vapor deposition technique without the shortcomings of the prior art methods.

It is another object of the present invention to provide a novel method of depositing silicon dioxide films on semiconductor substrates by a chemical vapor deposition technique such that conventional CVD equipment can be used.

It is yet another object of the present invention to provide a novel method of depositing silicon dioxide films on semiconductor substrates by a chemical vapor deposition technique such that the frequently occurring step coverage problem in an advanced semiconductor manufacturing process can be avoided.

It is a further object of the present invention to provide a novel method of depositing silicon dioxide films on semiconductor substrates by a chemical vapor deposition technique in which a mixture of reactant gases of tetra-ethoxy-ortho-silicate and activated oxygen are used in a carrier gas of oxygen.

SUMMARY OF THE INVENTION

In accordance with the present invention, a novel method of depositing silicon dioxide films on semiconductor substrates by a chemical vapor deposition technique is provided.

In the preferred embodiment, the novel deposition technique is carried out by flowing a mixture of reactant gases of tetra-ethoxy-ortho-silicate and acetic-acid together with water vapor into a chemical vapor deposition chamber and heated to a temperature higher than the ambient temperature.

In an alternate embodiment, a novel method of depositing silicon dioxide films on semiconductor substrates by a chemical vapor deposition technique is carried out by flowing into the reaction chamber a mixture of reactant gases of tetra-ethoxy-ortho-silicate and activated oxygen derived from hydrogen peroxide together with a carrier gas of oxygen by bubbling the oxygen carrier gas in hydrogen peroxide.

In another alternate embodiment, the novel method of depositing silicon dioxide films on semiconductor substrates by a chemical vapor deposition technique is carried out by flowing into the reaction chamber a mixture of reactant gases of tetra-ethoxy-ortho-silicate and activated oxygen derived from hydrogen peroxide together with a carrier gas of oxygen in which the hydrogen peroxide gas is injected directly into the oxygen carrier gas for feeding into the reaction chamber. The reaction chambers used in both alternate embodiments are heated to a temperature higher than the ambient temperature.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

Figure 1:
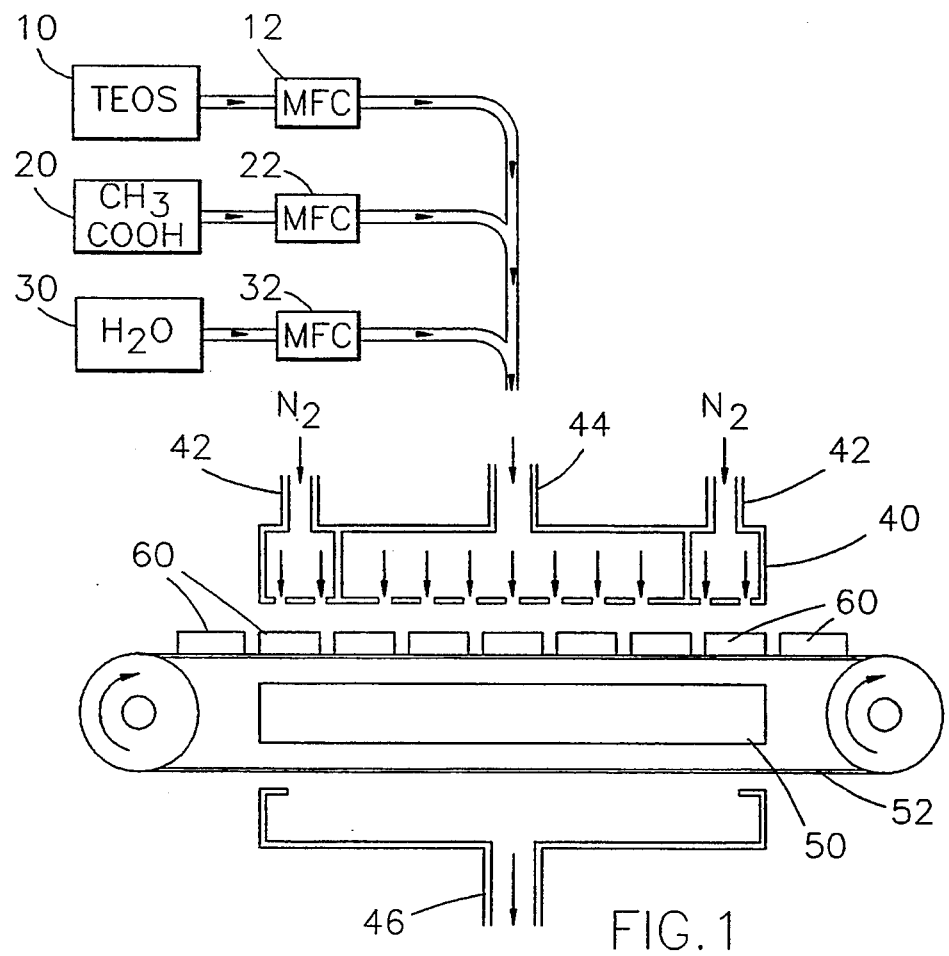
FIG. 1 is a diagram illustrating the configuration of the equipment used in the chemical vapor deposition of silicon dioxide films in the preferred embodiment.

Referring initially to FIG. 1, a diagram is shown illustrating the equipment used in a chemical vapor deposition process of silicon dioxide films in the preferred embodiment. In this CVD equipment, TEOS, acetic-acid ($CH_3COOH$) and water ($H_2O$) are gasified independently by vaporizers 10, 20 and 30. From vaporizers 10, 20 and 30, the gasified vapors flow to chamber 40 through mass flow rate controllers 12, 22 and 32.

At the two inlet openings 42 of chamber 40, nitrogen gas is injected into the chamber to block off the atmosphere. As the mixture of reactant gases is fed from inlet 44 into chamber 40, a chemical reaction is induced by the heat supplied from heater 50 forming a silicon dioxide film on substrate 60 carried on conveyor belt 52.

In this process, the feed materials, TEOS, acetic-acid and water can be procured easily and can be vaporized in a stable condition at room temperature. These materials are gasified by independent vaporizers 10, 20 and 30 respectively, and fed into chamber 40 of a conventional CVD equipment for the deposition process.

In this preferred embodiment of a TEOS/acetic-acid/water system, the water vapor is used to increase the reactivity of TEOS and acetic-acid so that the chemical reaction in the chamber can be carried out to form tetra-hydroxy-silicon ($Si(OH)_4$) with good flow characteristics. Two water molecules are then detached from tetra-hydroxy-silicon in a dehydration process to form silicon dioxide.

In this TEOS/acetic-acid/water system, the reactivity of TEOS and acetic-acid is increased by the water vapor because the oxygen atoms that form TEOS are highly electro-negative and thus they react easily with the electrophilic reagent of the hydrogen ions. Consequently, a chemical vapor deposition process can be carried out under conditions that enable implementation in a conventional CVD equipment. The processing conditions of this preferred embodiment are shown in Table I.

TABLE I

|  | Ambient Pressure | Reduced Pressure | Plasma Excitation Conditions |
|---|---|---|---|
| Pressure (Torr) | 760 | 10~100 | 1~10 |
| Temperatue (°C.) | 250~350 | 250~350 | 200~300 |
| TEOS Liquid Temperature (°C.) | ←25~35 (Bubbler Used)→ | | |
| $N_2$ Carrier (sccm) | 1000 | 1000 | 500 |
| TEOS:Acetic-Acid:Water (Equivalent Molar Ratio) | ←1:10~20:20~40→ | | |

In chamber 40, under the conditions shown in Table I, the following chemical reactions take place to form highly flowable tetra-hydroxy-silicon ($Si(OH)_4$). These are shown in reactions (1) and (2).

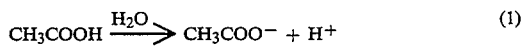

$$CH_3COOH \xrightarrow{H_2O} CH_3COO^- + H^+ \quad (1)$$

$$Si(OC_2H_5)_4 + 4H^+ \xrightarrow{H_2O} Si(OH)_4 + 4C_2H_5^+ \quad (2)$$

The $C_2H_5^+$ formed in reaction (2) generates ethyl acetate ($CH_3COOC_2H_5$) and ethyl alcohol ($C_2H_5OH$) as shown in reactions (3) and (4).

$$C_2H_5 + CH_3COO^- \xrightarrow{H_2O} CH_3COOC_2H_5 \quad (3)$$

$$C_2H_5^+ \xrightarrow{H_2O} C_2H_5OH + H^+ \quad (4)$$

Ethyl acetate and ethyl alcohol generated in these reactions are very highly volatile. Due to the azeotropic effect with water, they are immediately exhausted through outlet 46 of chamber 40. In addition, once a hydrogen ion $H^+$ is formed according to reaction (4), it can be used several times in reaction (2) and thus the reaction efficiency can be increased.

Since tetra-hydroxy-silicon $Si(OH)_4$ formed in reaction (2) has a high fluidity, it flows into the grooves of the step portion on a semiconductor substrate 60 (FIG. 1) and thus deposition is achieved with good step coverage. At the deposition temperature, tetra-hydroxy-silicon has two water molecules detached from it to form silicon dioxide film. This is shown in reaction (5).

$$Si(OH)_4 \rightarrow SiO_2 + 2H_2O \quad (5)$$

In the preferred embodiment, the conventional technology of formation of silicon dioxide using TEOS and ozone has been illustrated. In practice, the activated oxygen, i.e. the active oxygen atoms known as the oxygen in the generation period, that is generated by the decomposition of ozone at a high temperature chemically reacts with TEOS in the following reactions.

$$O_3 \rightarrow O_2 + [O] \quad (6)$$

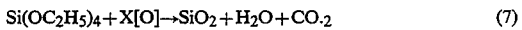

$$Si(OC_2H_5)_4 + X[O] \rightarrow SiO_2 + H_2O + CO_2 \quad (7)$$

Consequently, when a large amount of ozone is introduced, the number of active oxygen atoms is increased and the reaction can be completed.

In the first alternate embodiment, the activated oxygen needed for the reaction with TEOS is derived from hydrogen peroxide. Hydrogen peroxide is stable at room temperature and can have a concentration as high as 98% even in an industrial grade. Thus, instead of reaction (6), the following chemical reaction is carried out:

$$H_2O_2 \rightarrow H_2O + [O] \quad (8)$$

In this reaction, the activated oxygen which can be prepared easily is used. The chemical reaction between TEOS and hydrogen peroxide can be carried out under the conditions appropriate for using conventional CVD equipment as illustrated in Table II.

TABLE II

|  | Atmospheric Pressure | Reduced Pressure | Plasma Excitation Conditions |
|---|---|---|---|
| Pressure (Torr) | 760 | 10~100 | 1~10 |

TABLE II-continued

| | Atmospheric Pressure | Reduced Pressure | Plasma Excitation Conditions |
|---|---|---|---|
| Temperature (°C.) | 300~400 | 300~400 | 250~400 |
| TEOS Liquid Temperature (°C.) | 25~35 (Bubbler Used) | | |
| $N_2$ Carrier (sccm) | 1000 | 1000 | 500 |
| $H_2O_2$ Liquid Temperature (°C.) | 25~35 (Bubbler Used) | | |
| $O_2$ Carrier (sccm) | 2000~4000 | 2000~4000 | 500~1000 |

Figure 2:
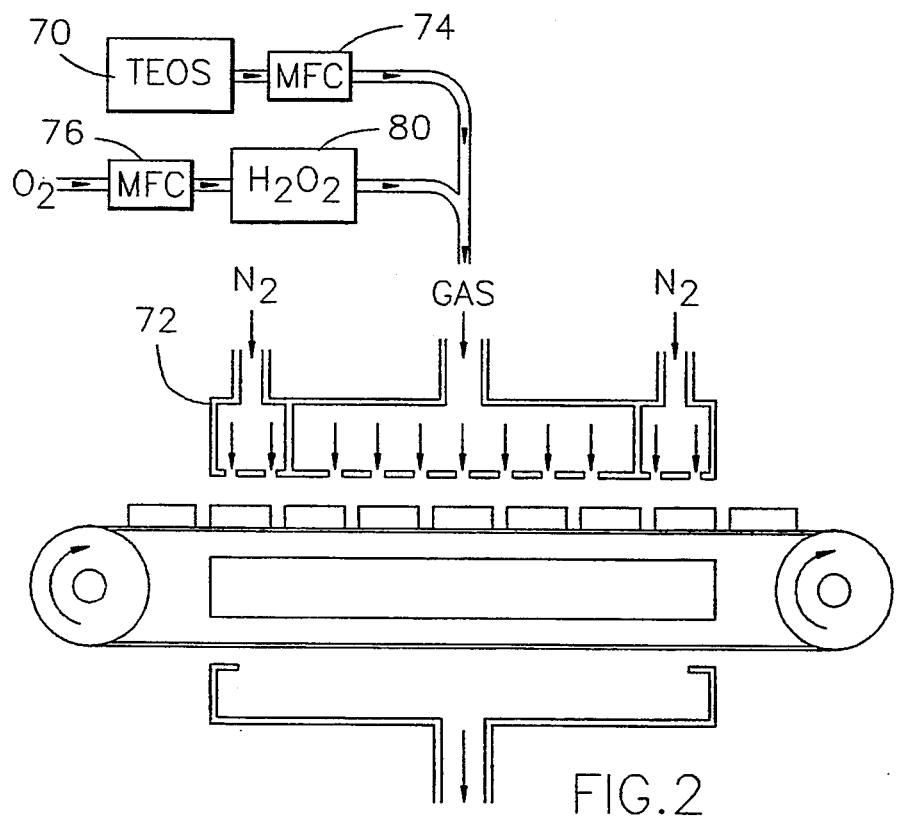
FIG. 2 is a diagram illustrating the configuration of the equipment used in the chemical vapor deposition of silicon dioxide films in the first alternate embodiment.
Figure 3:
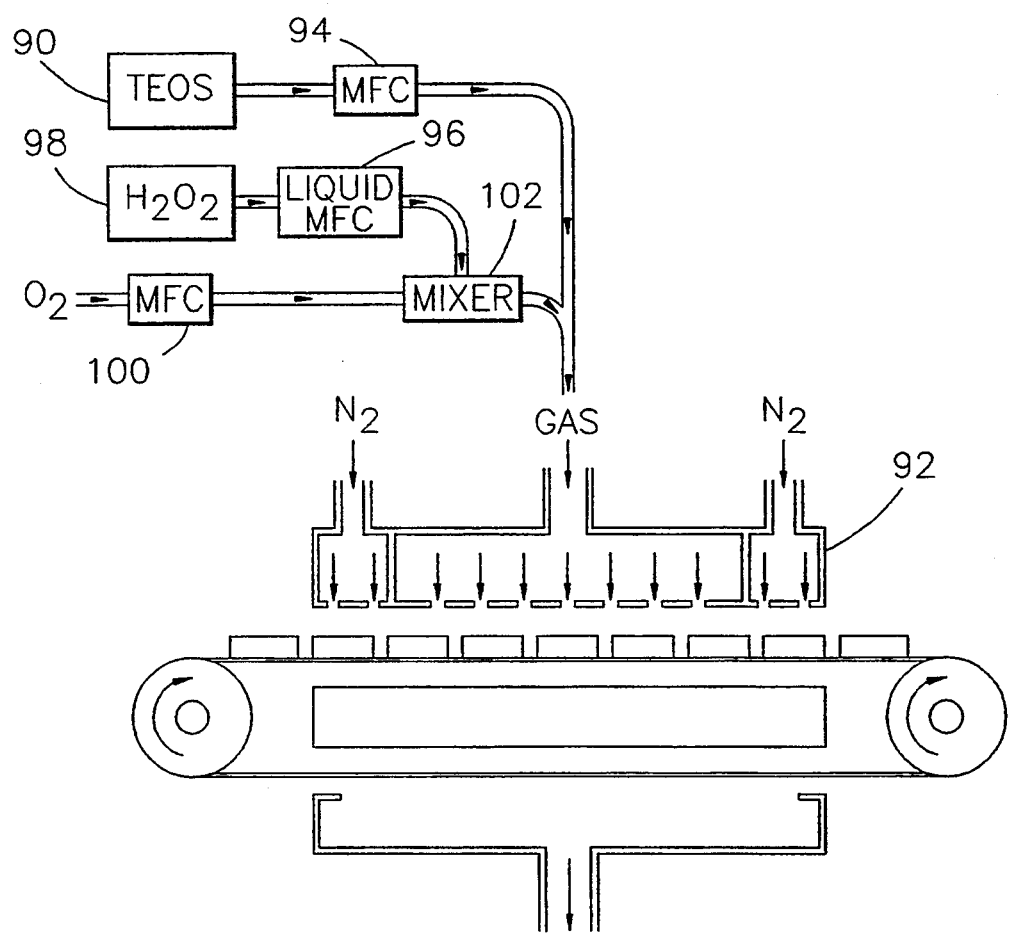
FIG. 3 is a diagram illustrating the configuration of the equipment used in the chemical vapor deposition of silicon dioxide films in the second alternate embodiment.

The method which can be used to obtain activated oxygen as depicted in reaction (8) is shown in FIG. 2. The bubbling of hydrogen peroxide is carried out by using an oxygen carrier gas. FIG. 3 shows another alternate embodiment in which hydrogen peroxide is injected directly into the oxygen carrier gas.

Referring now to FIG. 2, where vapor of TEOS gasified by vaporizer 70 is fed into chamber 72 with its flow rate controlled by mass flow rate controller 74. Oxygen carrier gas with its flow rate controlled by mass flow rate controller 76 is injected into tank 80 containing hydrogen peroxide. The active oxygen thus derived according to reaction (8) is fed into chamber 72.

As shown in FIG. 3, TEOS vapor gasified by vaporizer 90 is fed into chamber 92 with its flow rate controlled by flow rate controller 94. Hydrogen peroxide from tank 98 with its flow rate controlled by liquid mass flow rate controller 96 is directly injected into the oxygen carrier gas. The oxygen carrier gas with its flow rate controlled by flow rate controller 100 is mixed with hydrogen peroxide in mixer 102. The active oxygen derived according to reaction (8) is then fed into chamber 92. Chambers 72 and 92 shown in FIGS. 2 and 3 have the same configuration as chamber 40 shown in FIG. 1.

In chambers 40, 72 and 92, water molecules generated in the chemical reaction in any one of the embodiments can enter into a reaction for polysiloxane $(SiO_2)_n$ formed on the semiconductor substrate. These water molecules retard the formation of a crosslinking reaction, increase the fluidity, and thus improve the step coverage of a deposited film. On the other hand, the water molecules left in the polysiloxane can be detached easily in a subsequently performed heat treatment process. After such heat treatment process, the polysiloxane compound becomes stable.

The present invention has been illustrated in a preferred embodiment and two alternate embodiments. In the preferred embodiment, TEOS, acetic-acid and water are gasified independently and fed into a reaction chamber. In the reaction chamber, vapor is heated and a silicon dioxide film is deposited on the semiconductor substrate positioned in the reaction chamber. In the alternate embodiment, the gasified TEOS and the active oxygen derived either by bubbling hydrogen peroxide with oxygen carrier gas or by directly injecting hydrogen peroxide into oxygen carrier gas are fed into a reaction chamber. Vapor is then heated and a silicon dioxide film is deposited on a substrate positioned in the chamber.

The present invention therefore allows the deposition of a silicon dioxide film that has an excellent step coverage without the need of using multiple-stage operations required in a conventional coating method. Furthermore, a large-area silicon dioxide film can be deposited uniformly on a substrate.

In the method disclosed in the preferred and alternate embodiments, the feed materials of TEOS, acetic-acid, water, oxygen, and hydrogen peroxide are in stable form at room temperature and can be obtained at high purity levels. Consequently, the deposition process can be carried out with a higher stability than those deposition processes using hydrochloric acid or other volatile inorganic acid. Furthermore, the equipment is not corroded in the present method so that there is no need to take any precautions for protecting the equipment.

In addition, the feed materials used in the present invention can be gasified easily. Consequently, the conventional CVD equipment and technology can be easily adapted. The shortcomings that are frequently encountered in a conventional method that utilizes ozone or plasma excitation, i.e. mixing of metal impurities, generation of particles, etc. can be avoided.

While the present invention has been described in an illustrative manner, it should be understood that the terminology used is intended to be in a nature of words of description rather than of limitation.

Furthermore, while the present invention has been described in terms of a preferred embodiment and two alternate embodiments, it is to be appreciated that those skilled in the art will readily apply these teachings to other possible variations of the invention.

The embodiments of the invention in which an exclusive property or privilege is claimed are defined as follows.

I claim:

1. A method of depositing a silicon dioxide film on a substrate positioned in a chemical vapor deposition chamber comprising the step of flowing a mixture of tetra-ethoxy-ortho-silicate gas and gaseous acetic-acid together with water vapor into said chamber at a temperature higher than the ambient temperature.

2. A method according to claim 1, wherein said mixture of gases is flowed into the deposition chamber by a carrier gas of nitrogen.

3. A method of according to claim 2, wherein said substrate is a semiconductor wafer.

4. A method according to claim 3, wherein said chemical vapor deposition (CVD) chamber is selected from the group consisting of an atmospheric-pressure CVD chamber, a reduced-pressure CVD chamber and a plasma CVD chamber.

* * * * *